US009070562B2

(12) United States Patent
Loechelt et al.

(10) Patent No.: US 9,070,562 B2
(45) Date of Patent: Jun. 30, 2015

(54) CIRCUIT INCLUDING A SWITCHING ELEMENT, A RECTIFYING ELEMENT, AND A CHARGE STORAGE ELEMENT

(71) Applicant: SEMICONDUCTOR COMPONENTS INDUSTRIES, LLC, Phoenix, AZ (US)

(72) Inventors: Gary H. Loechelt, Tempe, AZ (US); Carroll Casteel, Chandler, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 156 days.

(21) Appl. No.: 13/794,038

(22) Filed: Mar. 11, 2013

(65) Prior Publication Data

US 2014/0252409 A1    Sep. 11, 2014

(51) Int. Cl.
| | |
|---|---|
| H02M 3/158 | (2006.01) |
| H01L 27/06 | (2006.01) |
| H03K 17/0814 | (2006.01) |
| H03K 17/16 | (2006.01) |
| H03K 17/74 | (2006.01) |
| H02M 1/32 | (2007.01) |
| H02M 7/538 | (2007.01) |

(52) U.S. Cl.
CPC ......... *H01L 27/0629* (2013.01); *H02M 3/1588* (2013.01); *H03K 17/0814* (2013.01); *H03K 17/162* (2013.01); *H03K 17/74* (2013.01); *H02M 1/32* (2013.01); *H02M 7/538* (2013.01)

(58) Field of Classification Search
CPC ............................... H02M 1/32; H02M 7/538
USPC .......... 323/222–225, 268–275, 282–285, 304
See application file for complete search history.

(56) References Cited

U.S. PATENT DOCUMENTS

| | | | | |
|---|---|---|---|---|
| 5,966,003 A   * | 10/1999 | Takimoto et al. | ............. | 323/224 |
| 6,940,189 B2 * | 9/2005  | Gizara         | ............  | 307/151 |
| 7,436,070 B2 * | 10/2008 | Uno et al.     | ............  | 257/777 |
| 7,462,897 B2 * | 12/2008 | Endo           | ............  | 257/291 |
| 7,495,877 B2 * | 2/2009  | Havanur        | ............  | 361/111 |
| 7,687,902 B2   | 3/2010  | Shiraishi et al. | | |
| 8,222,695 B2   | 7/2012  | Loechelt et al. | | |
| 8,299,560 B2   | 10/2012 | Loechelt et al. | | |
| 8,664,927 B2 * | 3/2014  | Shono          | ............  | 323/282 |

(Continued)

FOREIGN PATENT DOCUMENTS

| | | |
|---|---|---|
| EP | 1244202 A2    | 9/2002 |
| WO | 0163675 A1    | 8/2001 |
| WO | 2007048196 A1 | 5/2007 |

OTHER PUBLICATIONS

European Search Report dated May 14, 2014 from EP Application No. 14157818.7, 7 pages.

*Primary Examiner* — Timothy J Dole
*Assistant Examiner* — Yusef Ahmed
(74) *Attorney, Agent, or Firm* — Abel Law Group, LLP

(57) ABSTRACT

A circuit can include a pair of switching elements that have terminals electrically connected to terminals of a power supply and have other terminals electrically connected to an output terminal. The circuit can include rectifying elements and one or more charge storage elements. The circuit may be used as a Buck converter. The rectifying element(s) and charge storage element(s) may help to reduce ringing at an output terminal of the circuit during normal operation and reduce the likelihood of exceeding a breakdown voltage between current-carrying electrodes of a switching element within the circuit during a switching operation.

20 Claims, 3 Drawing Sheets

(56) References Cited

U.S. PATENT DOCUMENTS

| | | | |
|---|---|---|---|
| 2002/0064061 A1* | 5/2002 | Mino et al. ........................ | 363/37 |
| 2004/0135248 A1 | 7/2004 | Takagawa et al. | |
| 2004/0207335 A1* | 10/2004 | Nerone et al. ............. | 315/209 R |
| 2006/0097707 A1* | 5/2006 | Inoshita et al. ................ | 323/222 |
| 2008/0111528 A1* | 5/2008 | Wang ............................ | 323/282 |
| 2008/0122497 A1* | 5/2008 | Ishikawa et al. ............... | 327/108 |
| 2009/0168471 A1* | 7/2009 | Tsugawa et al. ........... | 363/56.01 |
| 2009/0302814 A1* | 12/2009 | Kapels et al. ................. | 323/282 |
| 2011/0018618 A1* | 1/2011 | Shiu et al. ..................... | 327/536 |
| 2011/0156682 A1 | 6/2011 | Girdhar et al. | |
| 2011/0227630 A1* | 9/2011 | Shinoda et al. ............... | 327/434 |
| 2011/0309682 A1* | 12/2011 | Chiba ............................. | 307/75 |
| 2012/0306464 A1* | 12/2012 | Hirler et al. ................... | 323/282 |
| 2013/0063119 A1* | 3/2013 | Lubomirsky ................. | 323/304 |
| 2013/0200952 A1* | 8/2013 | Williams ....................... | 330/251 |
| 2013/0325380 A1* | 12/2013 | Behnke et al. ................. | 702/64 |

* cited by examiner

US 9,070,562 B2

CIRCUIT INCLUDING A SWITCHING ELEMENT, A RECTIFYING ELEMENT, AND A CHARGE STORAGE ELEMENT

FIELD OF THE DISCLOSURE

The present disclosure relates to circuits including switching elements, rectifying elements, and charge storage elements.

RELATED ART

Insulated gate field-effect transistors (IGFETs) are a common type of power switching device. IGFETs can be connected to provide a switching circuit, such as the switching circuit 100 in FIG. 1, which allows an output voltage to be at substantially the higher voltage or the lower voltage of a power source 102. Two n-channel IGFETs 122 and 124 are connected such that the drain of the IGFET 122 is electrically connected to a positive terminal of the power source 102, and the source of the IGFET 124 is electrically connected to a negative terminal of the power source 102. The source of the IGFET 122 and the drain of the IGFET 124 are electrically connected to an output terminal that provides $V_{out}$. The gates of the IGFETs 122 and 124 are electrically connected to input terminals that provide $V_{in1}$ and $V_{in2}$.

The input terminals control the switching circuit 100. Ideally, when the states of the IGFETs 122 and 124 is switched such that the IGFET 122 is on and the IGFET 124 is off, $V_{out}$ will instantaneously be at the voltage of the positive terminal of the power source 102, without any overshoot of the voltage, undershoot of the voltage, or ringing (oscillating between overshoot and undershoot voltages) at the output terminal. Ideally, when the states of the IGFETs 122 and 124 is switched such that the IGFET 122 is off and the IGFET 124 is on, $V_{out}$ will instantaneously be at the voltage of the negative terminal of the power source 102, without any overshoot of the voltage, undershoot of the voltage, or ringing (oscillating between overshoot and undershoot voltages) at the output terminal.

The switching circuit 100 is not ideal and has parasitic characteristics between the source of the IGFET 122, the drain of the IGFET 124, and the output terminal $V_{out}$, even though the three are electrically connected to one another. The parasitic characteristics can be modeled as parasitic elements, such as parasitic resistance and parasitic inductance, which are represented within dashed boxes in the figures. In the switching circuit 100, the parasitic characteristics are modeled with a parasitic resistance 132 and a parasitic inductance 134 connected in series between source of the IGFET 122 and the output terminal. As will be discussed later in the specification, the parasitic characteristics can cause ringing at the output node, which can include significant voltage overshoot that can exceed the drain-to-source breakdown voltage of the IGFET 124, damage to a load (not illustrated) coupled to the output terminal, or another adverse effect.

BRIEF DESCRIPTION OF THE DRAWINGS

Embodiments are illustrated by way of example and are not limited in the accompanying figures.

Figure 1:
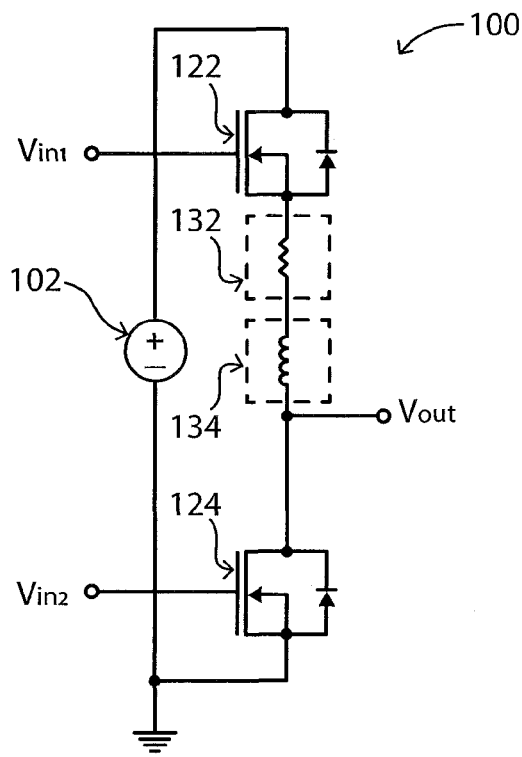
FIG. 1 includes a diagram of a switching circuit. (Prior art)

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. Also, for conceptual simplicity, some structures that are represented by a single circuit element may in fact correspond to multiple physical elements connected either in series, in parallel, or in some other series and parallel combination.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

As used herein, the term "coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be transferred from one to another. Non-limiting examples of "coupled" can include electrical connections between electronic component(s), circuit(s) or electronic component(s) with switch(es) (e.g., transistor(s)) connected between them, or the like.

The term "electrically connected," with respect to electronic components, circuits, or portions thereof, is intended to mean that two or more electronic components, circuits, or any combination of at least one electronic component and at least one circuit do not have any intervening electronic component lying between them. Parasitic resistance, parasitic capacitance, parasitic inductance, or any combination thereof is not considered electronic components for the purposes of this definition. In one embodiment, electronic components are electrically connected when they are electrically shorted to one another and lie at substantially the same voltage.

The term "normal operation" and "normal operating state" refer to conditions under which an electronic component or device is designed to operate. The conditions may be obtained from a data sheet or other information regarding voltages, currents, capacitance, resistance, or other electrical conditions. Thus, normal operation does not include operating an electrical component or device well beyond its design limits.

The term "power transistor" is intended to mean a transistor that is capable of maintaining at least a 10 V difference between a drain and a source of a field-effect transistor or between a collector and an emitter of a bipolar transistor when the field-effect or bipolar transistor is in an off state.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A circuit can include a pair of switching elements that have terminals electrically connected to terminals of a power supply and have other terminals electrically connected to an output terminal. The circuit can include one or more rectifying elements electrically connected in parallel with a corresponding switching element. The circuit can further include one or more charge storage elements electrically connected between the terminals of the power supply. In a particular embodiment, the switching elements are transistors, and each transistor has a corresponding rectifying element electrically connected in parallel with the transistor. The rectifying element can be a pn junction diode, a Schottky diode, or any combination thereof. The storage element can be a capacitor having a parallel plate capacitor structure, a transistor structure, or the like. In a particular embodiment, a capacitor is implemented such that the parasitic characteristics between an electrode of the capacitor and one of the terminals of power supply are significantly less than the parasitic characteristics of the other electrode of the capacitor and the other terminal of the power supply. In a particular embodiment, the circuit can be a Buck converter. Details regarding the circuits are better understood with respect to particular embodiments as described below, where such embodiments are merely illustrative and do not limit the scope of the present invention.

Figure 2:
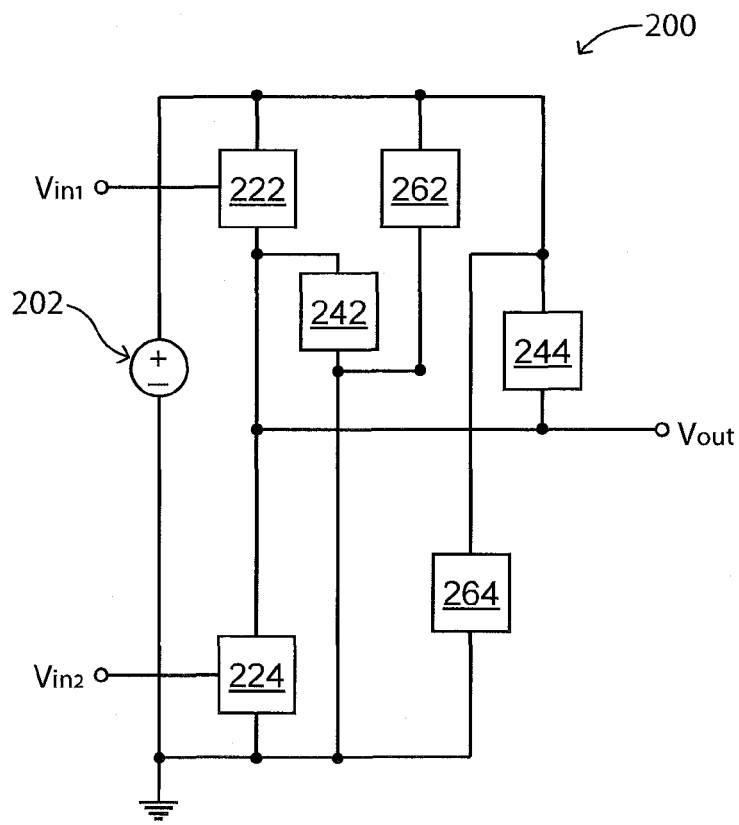
FIG. 2 includes a diagram of a circuit in accordance with an embodiment.

FIG. 2 includes a diagram of a circuit 200 in accordance with an embodiment. A power supply 202 provides power to the circuit 200 and includes a positive terminal and a negative terminal that is coupled to ground. In another embodiment, more than one power supply may be used or only one of the terminals of the power supply 202 is coupled to the circuit 200. In a further embodiment, the circuit 200 is coupled to terminals of a power supply that has terminals that are not at ground potential. The power supply 202 may provide a nominal voltage of 1 V, 5 V, 12 V, 19 V, or another suitable voltage. In a particular embodiment, the power supply 202 is a direct current (DC) power supply. The power supply 202 can include a battery, generator, alternator, capacitor, or another suitable device that can provide power to the circuit 202. Additional circuitry may be used if needed or desired. For example, a bridge rectifier (not illustrated) or another suitable circuit may be used when the power supply 202 is an alternator, and the circuit 200 is to receive a DC voltage instead of an alternating current (AC) voltage. In a particular embodiment, the terminals of the power supply 202 are electrically connected to the circuit 200.

The circuit 200 includes a switching element 222 having a current-carrying terminal coupled to the positive terminal of the power supply 202, and another current-carrying terminal coupled to an output terminal of the circuit 200 that provides $V_{out}$. The circuit 200 includes a switching element 224 having a current-carrying terminal coupled to the negative terminal of the power supply 202, and another current-carrying terminal coupled to the output terminal. The switching elements 222 and 224 have control electrodes that are coupled to input terminals for the circuit 200 that provide $V_{in1}$ and $V_{in2}$, respectively to the circuit 200.

The switching elements 222 and 224 can be field-effect transistors, bipolar transistors, another suitable switching element structure for a switching circuit, or any combination thereof. Each of the switching elements 222 and 224 can include a plurality of transistor structures that are connected in parallel, such that the combination of transistor structures is electrically equivalent to a single transistor.

The circuit 200 further includes rectifying elements 242 and 244. The rectifying element 242 has an anode that is coupled to the negative terminal of the power supply 202, and a cathode that is coupled to current-carrying electrodes of the switching elements 222 and 224. The rectifying element 244 has an anode that is coupled to current-carrying electrodes of the switching elements 222 and 224, and a cathode that is coupled to the positive terminal of the power supply 202.

The rectifying elements 242 and 244 can be pn junction diodes, Schottky diodes, another suitable rectifying element structure, or any combination thereof. Each of the rectifying elements 242 and 244 can include a plurality of diodes that are connected in parallel, such that the combination of diodes is electrically equivalent to a single diode.

The circuit 200 still further includes charge storage elements 262 and 264. The charge storage element 262 has an electrode that is coupled to the positive terminal of the power supply 202, and another electrode that is coupled to the anode of the rectifying element 242. The charge storage element 264 has an electrode that is coupled to the cathode of the rectifying element 244, and another electrode that is coupled to the negative terminal of the power supply 202.

The charge storage elements 262 and 264 can be in the form of parallel-plate capacitor structures, field-effect transistor structures, another suitable charge storage element structure, or any combination thereof. Each of the charge storage elements 262 and 264 can include a plurality of structures that are connected in parallel, such that the combination of structures is electrically equivalent to a single capacitor.

Figure 3:
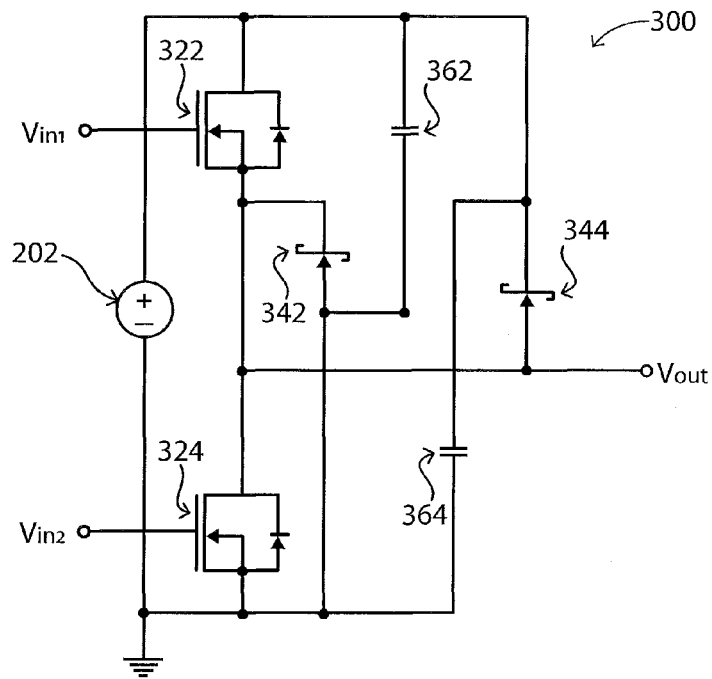
FIG. 3 includes a diagram of the circuit in FIG. 2 with particular circuit elements in accordance with a particular embodiment.

FIG. 3 includes a diagram of a particular circuit 300 that is a non-limiting implementation of the circuit 200 in accordance with an embodiment. The circuit 300 as illustrated in FIG. 3 is a switching circuit, and more particularly is a Buck converter and can be used as a high-frequency voltage regulator. The switching elements 222 and 224 in FIG. 2 are n-channel IGFETs 322 and 324 in FIG. 3. The IGFETs 322 and 324 have their bodies tied to their sources.

The active regions of the IGFETs 322 and 324 form pn junction diodes. The pn junction diodes of the IGFETs 322 and 324 can be used to determine maximum sustainable voltage differences that can be maintained across the drains and sources of the IGFETs 322 and 324. Such a voltage difference can be referred to as a drain-to-source breakdown voltage. The normal operating voltages of the switching circuit 200 may determine the breakdown voltage in selecting the IGFETs. The breakdown voltage may be at least two times the voltage between the terminals of the power supply 202. For example, if the power supply 202 has a nominal voltage of 12 V, the IGFETs 322 and 324 can have a drain-to-source breakdown voltage of at least approximately 24 V. In a non-limiting embodiment, the drain-to-source breakdown voltages of the IGFETs 322 and 324 are at least approximately 30 V. The IGFETs 322 and 324 may have approximately the same drain-to-source breakdown voltage or different drain-to-source breakdown voltages. As will be discussed later in this specification, the rectifying and charge storage elements help to reduce the likelihood that the drain-to-source breakdown of an IGFET does not occur during a transient time after the state of one or both of the IGFETs is changed.

The rectifying elements 242 and 244 in FIG. 2 are Schottky diodes 342 and 344 in FIG. 3. In another embodiment, each of the Schottky diodes 342 and 344 can be replaced by pn diodes, or a combination of pn junction diodes and Schottky diodes. The reverse-bias breakdown voltage may be no greater than approximately 2.0 times the drain-to-source breakdown voltage. In a particular embodiment, the reverse-bias breakdown voltage may be no greater than approximately 1.5 times the drain-to-source breakdown voltage, and in a more particular embodiment, the reverse-bias breakdown voltage may be no greater than approximately 1.2 times the drain-to-source breakdown voltage. In an even more particular embodiment, the reverse-bias breakdown voltage may be no greater than approximately 1.0 times the drain-to-source breakdown voltage. The Schottky diodes 342 and 344 can have the same reverse-bias breakdown voltage or different reverse-bias breakdown voltages. In an embodiment, the rectifying element 242, the rectifying element 244, or each of the rectifying elements 242 and 244 can include a plurality of diodes, wherein at least one of the diodes has a reverse-bias breakdown as previously described. In a particular embodiment, all diodes within a set of diodes that make up rectifying element 242, rectifying element 244, or each of rectifying elements 242 and 244 can have a reverse-bias breakdown as previously described.

The charge storage elements 262 and 264 in FIG. 2 are capacitors 362 and 364 in FIG. 3. A ratio of the capacitance of the capacitor 362, capacitor 364, or each of capacitors 362 and 364 to the drain-to-source capacitance of the IGFET 322, the IGFET 324, or each of the IGFETs 322 and 324 can be at least approximately 1.5:1. In a particular embodiment, the capacitance of the capacitor 362, capacitor 364, or each of capacitors 362 and 364 to the drain-to-source capacitance can be at least approximately 2:1, and in a more particular embodiment, capacitance of the capacitor 362, capacitor 364, or each of capacitors 362 and 364 to the drain-to-source capacitance can be at least approximately 4:1. In another embodiment, the capacitance of the capacitor 362, capacitor 364, or each of capacitors 362 and 364 to the drain-to-source capacitance may be no greater than approximately 25:1. In a particular embodiment, the capacitance of the capacitor 362, capacitor 364, or each of capacitors 362 and 364 to the drain-to-source capacitance may be no greater than approximately 16:1, and in a more particular embodiment, capacitance of the capacitor 362, capacitor 364, or each of capacitors 362 and 364 to the drain-to-source capacitance may be no greater than approximately 9:1.

The capacitance of the capacitor 362, capacitor 364, or each of capacitors 362 and 364 can be expressed in absolute, rather than relative, terms. In an embodiment, the capacitance of the capacitor 362, capacitor 364, or each of capacitors 362 and 364 can be at least approximately 80 pF. In a particular embodiment, the capacitance of the capacitor 362, capacitor 364, or each of capacitors 362 and 364 can be at least approximately 200 pF, and in a more particular embodiment, capacitance of the capacitor 362, capacitor 364, or each of capacitors 362 and 364 can be at least approximately 1.5 nF. In another embodiment, the capacitance of the capacitor 362, capacitor 364, or each of capacitors 362 and 364 may be no greater than approximately 40 nF. In a particular embodiment, the capacitance of the capacitor 362, capacitor 364, or each of capacitors 362 and 364 may be no greater than approximately 30 nF, and in a more particular embodiment, capacitance of the capacitor 362, capacitor 364, or each of capacitors 362 and 364 may be no greater than approximately 20 nF. In a further embodiment, the capacitance of the capacitor 362, capacitor 364, or each of capacitors 362 and 364 can be in a range of approximately 1.5 nF to approximately 40 nF.

Many values have been provided for the electronic elements within the circuits 200 and 300. Such values are provided to illustrate and not to limit the scope of the concepts as described herein. After reading this specification, skilled artisans will appreciate that the selection of absolute or relative values depends upon the particular application or environment in which the circuit is to operate.

In the circuits as described in 200 and 300 in FIGS. 2 and 3, the couplings between circuit elements can be electrical connections. With respect to FIG. 3, the output node of the circuit 300 can include the source of the IGFET 322, the drain of IGFET 324, the cathode of the Schottky diode 342, and, the anode of the Schottky diode 344. Another node can include the positive terminal of the power supply 202, the drain of the IGFET 322, electrodes of the capacitors 362 and 364, and the cathode of the Schottky diode 344. A further node can include the negative terminal of the power supply 202, the source of the IGFET 324, the other electrodes of the capacitors 362 and 364, and the anode of the Schottky diode 342.

The circuit 300 in FIG. 3 does not take into account parasitic characteristics due to interconnections between the components. For example, the IGFETs 322 and 324 may be on different dies and include a metal strap to electrically connect the source of the IGFET 322, the drain of the IGFET 324, and the output terminal to one another. These connections can have parasitic characteristics that can significantly affect the operation of the circuit. The parasitic characteristics can be used when modeling the circuit.

Figure 4:
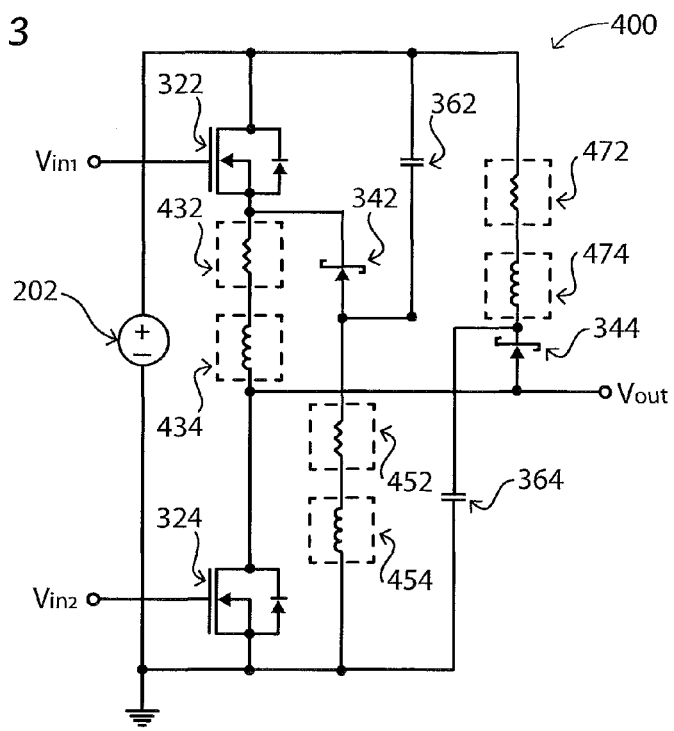
FIG. 4 includes a diagram of the circuit of FIG. 3 with parasitic characteristics represented with parasitic circuit elements.

FIG. 4 includes a circuit 400 that is similar to circuit 300 in FIG. 3. The circuit 400 includes parasitic resistances and parasitic inductances that are illustrated within dashed boxes. A parasitic resistor 432 and a parasitic inductor 434 are electrically connected in series between the cathode of the Schottky diode 342 and the output terminal. The Schottky diode 342 and capacitor 362 are physically located closer to the IGFET 322 than to the negative terminal of the power supply 202. The parasitic characteristics between the negative terminal of the power supply 202 and each of the Schottky diode 342 and the capacitor 362 are more significant than the parasitic characteristics between the IGFET 322 and each of the Schottky diode 342 and the capacitor 362. Thus, the parasitic characteristics are modeled using a parasitic resistor 452 and a parasitic inductor 454 connected in series between the negative terminal of the power supply 202 and each of the Schottky diode 342 and the capacitor 362. The Schottky diode 344 and capacitor 364 are physically located closer to the IGFET 324 than to the positive terminal of the power supply 202. The parasitic characteristics between the positive terminal of the power supply 202 and each of the Schottky diode 344 and the capacitor 364 are more significant than the parasitic characteristics between the IGFET 324 and each of the Schottky diode 344 and the capacitor 364. Thus, the parasitic characteristics are modeled using a parasitic resistor 472 and a parasitic inductor 474 connected in series between the positive terminal of the power supply 202 and each of the Schottky diode 344 and the capacitor 364.

For modeling purposes, parasitic resistors in FIGS. 1 and 4 can be assigned a value of less than 1 mΩ, and parasitic inductors in FIGS. 1 and 4 can be assigned a value of less than 1 nH. Although the inductance is relatively low, the circuits as described herein, including FIG. 1, are to operate at frequencies on the order of approximately 1 MHz with significant currents that are over 1000 times greater than typically currents seen with transistors that are used in digital logic circuits, such as memories. The relationship between voltage and inductance is V=L*(di/dt), and therefore, a very large value for di/dt can cause ringing as will be seen for the circuit of FIG. 1.

The circuits as described herein can be used as a high-frequency voltage regulator for a mobile electronic device, such as a laptop computer, a netbook, a table personal computer, or the like. In a non-limiting embodiment, the power supply can be a 12 VDC battery. During normal operation of the mobile electronic device, the battery may be connected to a charger, and the voltage across the terminals of the power supply can reach as high as 19 V. Thus, the circuit needs to be able to withstand such a voltage.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Item 1. A circuit can include a first switching element having a first current-carrying electrode and a second current-carrying electrode and a second switching element having a first current-carrying electrode and a second current-carrying electrode, wherein the first current-carrying electrode of the second switching element is coupled to the second current-carrying electrode of the first switching element. The circuit can further include a first rectifying element and a second rectifying element, each having an anode and a cathode. The anode of the first rectifying element can be coupled to the second current-carrying electrode of the first switching element, and the cathode of the first rectifying element can be coupled to the first current-carrying electrode of the first switching element. The anode of the second rectifying element can be coupled to the second current-carrying electrode of the second switching element, and the cathode of the second rectifying element can be coupled to the first current-carrying electrode of the second switching element. The circuit can still further include a first charge storage element having a first terminal and a second terminal, wherein the first terminal of the first charge storage element is coupled to the cathode of the first rectifying element, and the second terminal of the first charge storage element is coupled to the second current-carrying electrode of the second switching element.

Item 2. The circuit of Item 1, further including a second charge storage element having a first terminal and a second terminal, wherein the first terminal of the second charge storage element is coupled to the first current-carrying electrode of the first switching element, and wherein the second terminal of the second charge storage element is coupled to the anode of the second rectifying element.

Item 3. The circuit of Item 2, wherein the first charge storage element, the second charge storage element, or each of the first and second charge storage elements includes a capacitor.

Item 4. The circuit of Item 3, wherein the first charge storage element, the second charge storage element, or each of the first and second charge storage elements has a capacitance of at least approximately 80 pF.

Item 5. The circuit of Item 3, wherein the first charge storage element, the second charge storage element, or each of the first and second charge storage elements has a capacitance in a range of approximately 1.5 nF to approximately 40 nF.

Item 6. The circuit of Item 3, wherein the first charge storage element, the second charge storage element, or each of the first and second charge storage elements has a particular capacitance; the first switching element, the second switching element or each of the first and second switching elements has capacitance between its corresponding first and second current-carrying electrodes, and a ratio of the particular capacitance to the capacitance between its corresponding first and second current-carrying electrodes is at least 1.5:1.

Item 7. The circuit of Item 1, wherein the first rectifying element, the second rectifying element, or each of the first and second rectifying elements includes a Schottky diode or a pn junction diode.

Item 8. The circuit of Item 1, wherein the first rectifying element, the second rectifying element, or each of the first and second rectifying elements includes a Schottky diode and a pn junction diode that are electrically connected in parallel.

Item 9. The circuit of Item 8, wherein the first rectifying element has a breakdown voltage that is no greater than approximately 2.0 times a drain-to-source breakdown voltage of the first switching element; and the second rectifying element has a breakdown voltage that is no greater than approximately 2.0 times a drain-to-source breakdown voltage of the second switching element.

Item 10. The circuit of Item 1, wherein the first switching element is an insulated gate field-effect transistor that include a gate, wherein the first current-carrying electrode of the first switching element is a drain, and the second current-carrying electrode of the first transistor is a source; and the second switching element is another insulated gate field-effect transistor that includes a gate, wherein the first current-carrying electrode of the second switching element is a drain, and the second current-carrying electrode of the second switching element is a source.

Item 11. The circuit of Item 1, wherein the circuit is a switching circuit of a voltage regulator.

Item 12. A circuit can include a high-side transistor having a first current-carrying electrode and a second current-carrying electrode, and a low-side transistor having a first current-carrying electrode and a second current-carrying electrode, wherein the first current-carrying electrode of the low-side transistor is coupled to the second current-carrying electrode of the high-side transistor. The circuit can further include a rectifying element having an anode and a cathode, wherein the anode of the rectifying element is coupled to the second current-carrying electrode of the high-side transistor, and the cathode of the rectifying element is coupled to the first current-carrying electrode of the high-side transistor. The circuit still further includes a charge storage element having a first terminal and a second terminal, wherein the first terminal of the charge storage element is coupled to the first current-carrying electrode of the high-side transistor, and the second terminal of the charge storage element is coupled to the second current-carrying electrode of the low-side transistor.

Item 13. The circuit of Item 12, wherein the charge storage element includes a capacitor.

Item 14. The circuit of claim 13, wherein the charge storage element has a capacitance, the high-side transistor, the low-side transistor, or each of the high-side and low-side transistors has a capacitance between its corresponding first and second current-carrying electrodes, and a ratio of the capacitance to the capacitance between its corresponding first and second current-carrying electrodes is at least 1.5:1.

Item 15. The circuit of Item 12, wherein the rectifying element includes a Schottky diode and a pn diode electrically connected in parallel.

Item 16. The circuit of Item 15, wherein the rectifying element has a breakdown voltage that is no greater than approximately 2.0 times a drain-to-source breakdown voltage of the high-side transistor.

Item 17. A switching circuit can include a high-side transistor and a low side transistor, each having a source, a gate, and a drain. The drain of the high-side transistor can be electrically connected to a first power terminal, the gate of the high-side transistor can be electrically connected to a first input of the switching circuit; and the source of the high-side transistor can be electrically connected to an output terminal of the switching circuit. The drain of the low-side transistor can be electrically connected to the output terminal; the gate of the low-side transistor can be electrically connected to a second input of the switching circuit; and the source of the low-side transistor can be electrically connected to a second power terminal. The switching circuit can further include a first Schottky diode and a second Schottky diode, each having an anode and a cathode. The anode of the first Schottky diode can be electrically connected to the output terminal, and the cathode of the first Schottky diode can be electrically connected to the first power terminal; and the anode of the second Schottky diode can be electrically connected to the second power terminal, and the cathode of the Schottky diode can be electrically connected to the output terminal. The switching circuit can still further include a first capacitor and a second capacitor, each having a first terminal and a second terminal. The first terminal of the first capacitor can be electrically connected to the first power terminal, and the second terminal of the first capacitor can be electrically connected to the second power terminal; and the first terminal of the second capacitor can be electrically connected to the first power terminal, and the second terminal of the second capacitor can be electrically connected to the second power terminal.

Item 18. The circuit of Item 17, wherein each of the first and second capacitors has a capacitance in a range of approximately 1.5 nF to approximately 40 nF.

Item 19. The circuit of Item 17, wherein each of the first and second Schottky diodes has a breakdown voltage of no greater than approximately 2.0 times a drain-to-source breakdown voltage of each of the low-side and high-side transistors.

EXAMPLE

The concepts described herein will be further described in the Example, which does not limit the scope of the invention described in the claims. The Example demonstrates that combinations of rectifying elements and charge storage capacitors can be used to reduce ringing at an output terminal of a power switching circuit.

Figure 5:
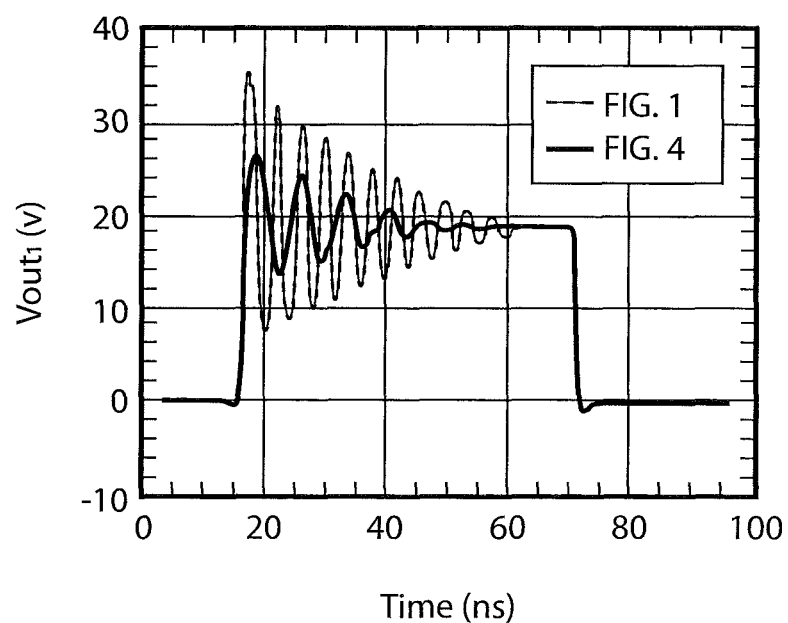
FIG. 5 includes a plot illustrating output voltages of circuits in accordance with FIGS. 1 and 4 after the voltage at the output terminal changes from a relatively low voltage to a relatively high voltage.

The circuits of FIGS. 1 and 4 are used to generate the data for the timing diagram of FIG. 5. The following values are assigned to the parasitic resistances and inductors in FIGS. 1 and 4:

Parasitic resistor 132, 250µΩ;
Parasitic inductor 134, 300 pH;
Parasitic resistor 432, 250µΩ;
Parasitic inductor 434, 300 pH;
Parasitic resistor 452, 25 mΩ;
Parasitic inductor 454, 150 pH;
Parasitic resistor 472, 50 mΩ; and
Parasitic inductor 474, 250 pH.

FIG. 5 includes a timing diagram that compares the voltage on the output terminal that provides $V_{out}$ as a function of time after a switching event has occurred when the power supply has 19 V across its terminals. At t=0, the IGFET 122 is off, and the IGFET 124 is on. The voltage on the output terminal is approximately 0 V. At approximately t=15 ns, the IGFET 124 is turned off, and then, the IGFET 122 is turned on. At t=0, the IGFET 322 is off, and the IGFET 324 is on. The voltage on the output terminal is approximately 0 V. At approximately t=15 ns, the IGFET 324 is turned off, and then, the IGFET 322 is turned on. Ideally, the voltage on the output terminal would go from 0 V to 19 V instantaneously with no voltage overshoot, undershoot, or ringing. The circuits as illustrated in FIGS. 1 and 4 are not ideal, and therefore, voltage overshoot, voltage undershoot, and ringing occurs.

Clearly, the circuit 400 in FIG. 4 provides significantly better performance as compared to circuit 100 in FIG. 1. The capacitors 362 and 364 can quickly charge and allow excess charge to be stored and reduce the amount of voltage overshoot and voltage undershoot. The Schottky diodes 342 and 344 help to provide a low impedance current path to the capacitors 362 and 364 during a voltage overshoot or undershoot, while blocking the flow of current when the output terminal is at a voltage equal to or between the voltages on the positive and negative terminals of the power supply. Without the capacitors 362 and 364 and the Schottky diodes 342 and 344, such as circuit 100 in FIG. 1, $V_{out}$ can reach 34 V, which exceeds the drain-to-source breakdown voltage of 30 V for the IGFET 124. With the capacitors 362 and 364 and the Schottky diodes 342 and 344, such as circuit 400 in FIG. 4, $V_{out}$ can reach 26 V, which is below the drain-to-source breakdown voltage of 30 V for the IGFET 324. Further, the ringing seen at the output terminal for the circuit 400 in FIG. 4 is substantially non-existent at least 15 ns sooner than for the output terminal of the circuit 100 in FIG. 1.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Accordingly, the disclosure is to be regarded as illustrative rather than restrictive.

What is claimed is:

1. A circuit comprising:
   a first switching element having a first current-carrying electrode and a second current-carrying electrode;
   a second switching element having a first current-carrying electrode and a second current-carrying electrode, wherein the first current-carrying electrode of the second switching element is coupled to the second current-carrying electrode of the first switching element;
   a first rectifying element having an anode and a cathode, wherein the cathode of the first rectifying element is coupled to the second current-carrying electrode of the first switching element;
   a second rectifying element having an anode and a cathode, wherein the anode of the second rectifying element is coupled to the first current-carrying electrode of the second switching element; and
   a first charge storage element having a first terminal and a second terminal, wherein the first terminal of the first charge storage element is coupled to the first current-carrying electrode of the first switching element, and the second terminal of the first charge storage element is coupled to the anode of the first rectifying element; and
   a second charge storage element having a first terminal and a second terminal, wherein the first terminal of the second charge storage element is coupled to the cathode of the second rectifying element, and wherein the second terminal of the second charge storage element is coupled to the second current-carrying terminal of the second switching element,
   wherein:
      a parasitic characteristic between a negative terminal of the circuit and the first charge storage element is more significant than a parasitic characteristic between the first switching element and the first charge storage element; or
      a parasitic characteristic between a positive terminal of the circuit and the second charge storage element is more significant than a parasitic characteristic between the second switching element and the second charge storage element.

2. The circuit of claim 1, wherein:
   parasitic characteristics between the negative terminal of the circuit and the first charge storage element are more significant than parasitic characteristics between the first switching element and the first charge storage element; and
   parasitic characteristics between the positive terminal of the circuit and the second charge storage element are more significant than parasitic characteristics between the second switching element and the second charge storage element.

3. The circuit of claim 1, wherein the first switching element and the second switching element are on different dies.

4. The circuit of claim 1, wherein
   the first charge storage element is closer to the first switching element than to the negative terminal of the circuit; or
   the second charge storage element is closer to the second switching element than to the positive terminal of the circuit.

5. The circuit of claim 1, wherein
   the first rectifying element is closer to the first switching element than to a negative terminal of the circuit; or
   the second rectifying element is closer to the second switching element than to a positive terminal of the circuit.

6. The circuit of claim 1, wherein the first charge storage element, the second charge storage element, or each of the first and second charge storage elements has a particular capacitance, the first switching element, the second switching element or each of the first and second switching elements has a capacitance between its corresponding first and second current-carrying electrodes, and a ratio of the particular capacitance to the capacitance between its corresponding first and second current-carrying electrodes is at least 1.5:1.

7. The circuit of claim 1, wherein the first rectifying element, the second rectifying element, or each of the first and second rectifying elements includes a Schottky diode or a pn junction diode.

8. The circuit of claim 1, wherein the first rectifying element, the second rectifying element, or each of the first and second rectifying elements includes a Schottky diode and a pn junction diode that are electrically connected in parallel.

9. The circuit of claim 8, wherein:
   the first rectifying element has a breakdown voltage that is no greater than approximately 2.0 times a drain-to-source breakdown voltage of the first switching element; and
   the second rectifying element has a breakdown voltage that is no greater than approximately 2.0 times a drain-to-source breakdown voltage of the second switching element.

10. The circuit of claim 1, wherein:
    the first switching element is an insulated gate field-effect transistor that include a gate, wherein the first current-carrying electrode of the first switching element is a drain, and the second current-carrying electrode of the first switching element is a source; and
    the second switching element is another insulated gate field-effect transistor that includes a gate, wherein the first current-carrying electrode of the second switching element is a drain, and the second current-carrying electrode of the second switching element is a source.

11. The circuit of claim 1, wherein the circuit is a switching circuit of a voltage regulator.

12. A circuit comprising:
    a high-side transistor having a first current-carrying electrode and a second current-carrying electrode;
    a low-side transistor having a first current-carrying electrode and a second current-carrying electrode, wherein the first current-carrying electrode of the low-side transistor is coupled to the second current-carrying electrode of the high-side transistor;
    a first rectifying element having an anode and a cathode, wherein the cathode of the first rectifying element is coupled to the second current-carrying electrode of the high-side transistor;
    a second rectifying element having an anode and a cathode, wherein the anode of the second rectifying element is coupled to the first current-carrying electrode of the low-side transistor; and
    a first charge storage element having a first terminal and a second terminal, wherein the first terminal of the first charge storage element is coupled to the first current-carrying electrode of the high-side transistor, and the second terminal of the first charge storage element is coupled to the anode of the first rectifying element; and
    a second charge storage element having a first terminal and a second terminal, wherein the first terminal of the second charge storage element is coupled to the cathode of the second rectifying element, and the second terminal of the second charge storage element is coupled to the second current-carrying electrode of the low-side transistor, wherein:
 a parasitic characteristic between a negative terminal of the circuit and the first charge storage element is more significant than a parasitic characteristic between the high-side transistor and the first charge storage element; or
 a parasitic characteristic between a positive terminal of the circuit and the second charge storage element is more significant than a parasitic characteristic between the low-side transistor and the second charge storage element; and wherein:
 the first rectifying element is closer to the high-side transistor than to a negative terminal of the circuit; or
 the second rectifying element is closer to the low-side transistor than to a positive terminal of the circuit.

13. The circuit of claim 12, wherein each of the first charge storage element and the second charge storage element includes a capacitor.

14. The circuit of claim 13, wherein the first or second charge storage element has a capacitance, the high-side transistor, the low-side transistor, or each of the high-side and low-side transistors has a capacitance between its corresponding first and second current-carrying electrodes, and a ratio of the capacitance of the first or second charge storage element to the capacitance between its corresponding first and second current-carrying electrodes is at least 1.5:1.

15. The circuit of claim 12, wherein the first or second rectifying element includes a Schottky diode and a pn diode electrically connected in parallel.

16. The circuit of claim 12, wherein the high-side transistor and the low-side transistor are on different dies.

17. A switching circuit comprising:
 a high-side transistor having a source, a gate, and a drain, wherein:
  the drain of the high-side transistor is electrically connected to a first power terminal;
  the gate of the high-side transistor is electrically connected to a first input of the switching circuit; and
  the source of the high-side transistor is electrically coupled to an output terminal of the switching circuit;
 a low-side transistor having a source, a gate, and a drain, wherein:
  the drain of the low-side transistor is electrically coupled to the output terminal;
  the gate of the low-side transistor is electrically connected to a second input of the switching circuit; and
  the source of the low-side transistor is electrically connected to a second power terminal;
 a first Schottky diode having an anode and a cathode, wherein the cathode of the first Schottky diode is electrically connected to the source of the high-side transistor;
 a second Schottky diode having an anode and a cathode, wherein the anode of the second Schottky diode is electrically connected to the drain of the low-side transistor;
 a first capacitor having a first terminal and a second terminal, wherein the first terminal of the first capacitor is electrically connected to the first power terminal, and the second terminal of the first capacitor is electrically connected to the anode of the first Schottky diode; and
 a second capacitor having a first terminal and a second terminal, wherein the first terminal of the second capacitor is electrically connected to the second power terminal, and the second terminal of the second capacitor is electrically connected to the cathode of the second Schottky diode, wherein:
 a parasitic characteristic between a negative terminal of the circuit and the first capacitor is more significant than a parasitic characteristic between the high-side transistor and the first capacitor; or
 a parasitic characteristic between a positive terminal of the circuit and the second capacitor is more significant than a parasitic characteristic between the low-side transistor and the second capacitor.

18. The circuit of claim 17, wherein:
 the first capacitor is closer to the high-side transistor than to the second power terminal; or
 the second capacitor is closer to the low-side transistor than to the first power terminal.

19. The circuit of claim 17, wherein each of the first and second Schottky diodes has a breakdown voltage of no greater than approximately 2.0 times a drain-to-source breakdown voltage of each of the low-side and high-side transistors.

20. The circuit of claim 17, wherein the high-side transistor and the low-side transistor are on different dies.

* * * * *